US011482615B2

(12) United States Patent
Cina' et al.

(10) Patent No.: US 11,482,615 B2
(45) Date of Patent: Oct. 25, 2022

(54) SUPER-JUNCTION POWER MOSFET DEVICE WITH IMPROVED RUGGEDNESS, AND METHOD OF MANUFACTURING

(71) Applicant: STMICROELECTRONICS S.R.L., Agrate Brianza (IT)

(72) Inventors: Giuseppe Cina', Misterbianco (IT); Antonio Giuseppe Grimaldi, S. Giovanni la Punta (IT); Luigi Arcuri, Misterbianco (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 58 days.

(21) Appl. No.: 16/869,026

(22) Filed: May 7, 2020

(65) Prior Publication Data
US 2020/0357918 A1    Nov. 12, 2020

(30) Foreign Application Priority Data

May 10, 2019    (IT) ........................ 102019000006709

(51) Int. Cl.
| H01L 29/78 | (2006.01) |
| H01L 29/06 | (2006.01) |
| H01L 29/423 | (2006.01) |
| H01L 29/66 | (2006.01) |

(52) U.S. Cl.
CPC ...... *H01L 29/7813* (2013.01); *H01L 29/0634* (2013.01); *H01L 29/4236* (2013.01); *H01L 29/66712* (2013.01)

(58) Field of Classification Search
CPC ............. H01L 29/7813; H01L 29/4236; H01L 29/66712; H01L 29/0634; H01L 29/0886
See application file for complete search history.

(56) References Cited

U.S. PATENT DOCUMENTS

| 6,413,822 B2 | 7/2002 | Williams et al. |
| 6,586,800 B2 | 7/2003 | Brown |
| 6,611,021 B1 * | 8/2003 | Onishi ................ H01L 29/0634 257/328 |
| 6,979,862 B2 * | 12/2005 | Henson ............... H01L 29/7813 257/330 |
| 10,074,741 B2 | 9/2018 | Aichinger et al. |

(Continued)

FOREIGN PATENT DOCUMENTS

| CN | 108198851 A * | 6/2018 | ......... H01L 29/0634 |
| CN | 111799334 A * | 10/2020 | |
| KR | 10-1590943 B1 | 2/2016 | |

*Primary Examiner* — Vincent Wall
(74) *Attorney, Agent, or Firm* — Seed IP Law Group LLP

(57) ABSTRACT

A vertical-conduction MOSFET device, includes: a semiconductor body, having a front side and a back side and having a first conductivity; a trench-gate region; a body region, having the first conductivity; a source region, having a second conductivity; and a drain region, having the second conductivity. The source region, body region, and drain region are aligned with one another along a first direction and define a channel area, which, in a conduction state of the MOSFET device, hosts a conductive channel. The drain region borders on a portion of the semiconductor body having the first conductivity, thus forming a junction diode, which, in an inhibition state of the MOSFET device, is adapted to cause a leakage current to flow outside the channel area.

24 Claims, 3 Drawing Sheets

(56) References Cited

U.S. PATENT DOCUMENTS

| | | | |
|---|---|---|---|
| 2005/0035371 A1* | 2/2005 | Fujihira | H01L 29/0619 257/200 |
| 2013/0087851 A1* | 4/2013 | Kagata | H01L 29/7827 257/329 |
| 2017/0263712 A1 | 9/2017 | Siemieniec et al. | |
| 2019/0189796 A1* | 6/2019 | Su | H01L 29/7806 |

* cited by examiner

SUPER-JUNCTION POWER MOSFET DEVICE WITH IMPROVED RUGGEDNESS, AND METHOD OF MANUFACTURING

BACKGROUND

Technical Field

The present disclosure relates to a MOSFET device, in particular a super-junction MOSFET, and to the corresponding method of manufacturing.

Description of the Related Art

As known, power devices are electronic devices adapted to work at high voltages and currents, for example with voltages that reach 1700 V in the inhibition state, and with currents up to several tens/hundreds of Ampere, and find use in multiple fields of application. For instance, they are commonly used as audio amplifiers, motor controls, power supplies or power switches, and include devices, such as power diodes, power transistors, thyristors, insulated gate bipolar transistors (IGBTs), metal-oxide semiconductor field-effect transistors (MOSFETs), and super-junction MOSFETs (SJ-MOSS).

In particular, FIG. 1 shows a known super-junction MOSFET, designated by the reference number 1, in a three-dimensional Cartesian reference system defined by orthogonal axes X, Y, and Z. The super-junction MOSFET 1 includes a semiconductor body 3, for example of silicon, having a front side 3a and a back side 3b opposite to one another in the direction of the axis Z. Extending in the back side 3b there is a drain region 5, having a conductivity type (for example, N) and a first doping value (N$^+$). Extending in electrical contact with the drain region 5 there is a metallization 6 (drain electrical terminal).

The semiconductor body 3 further comprises a conductive region 7, having a conductivity of an N type and a second doping value (N$^-$) lower than the first doping value of the drain region 5. The conductive region 7 extends on the drain region 5, and is delimited at the top by a top surface 7a and at the bottom by a bottom surface 7b. In this embodiment, the top surface 7a of the conductive region 7 coincides with the front side 3a of the semiconductor body 3. Body regions 9 extend in the conductive region 7. FIG. 1 shows in particular two body regions 9, having a conductivity different from the N conductivity (and thus, of a P type). The body regions 9 have, in the section view of FIG. 1, the shape of pillars, with a main extension along the direction of the axis Z (vertical extension). In other words, the body regions 9 extend vertically starting from the top surface 7a of the conductive region 7, until they come into contact with the bottom surface 7b of the conductive region 7.

The super-junction MOSFET 1 moreover has, on the top surface 7a of the conductive region 7 (i.e., along the direction of the axis Z, starting from the top surface 7a of the conductive region 7), an oxide layer 12, such as of silicon dioxide (SiO$_2$), which surrounds a gate layer 14 of conductive material, for example metal. The oxide layer 12 and the gate layer 14 extend over the top surface 7a of the conductive region 7, at least partially overlapping the body regions 9.

Source regions 13, having the first conductivity (here, of an N type), extend within the body regions 9, in portions of the latter not covered by the oxide layer 12.

A metallization 16 (source electrical terminal) extends over the oxide layer 12, the source regions 13, and the body regions 9, in electrical contact with the latter and with the body regions 9.

In a known way, during use, the super-junction MOSFET 1 is biased by applying a voltage $V_S$ to the metallization layer 16 (for example, a ground reference voltage GND, equal to 0 V), whereas a drain voltage $V_D$ (e.g., from 300 V to 1700 V) is applied to the drain region 5 via the metallization 6. Moreover, the gate layer 14 is biased at a gate voltage $V_G$ such as to generate respective channels 17 in each body region 9, in the proximity of the oxide layer 12, generating a respective flow of majority charge carriers (here electrons) 18.

When the super-junction MOSFET 1 is in an inhibition state, the gate voltage $V_G$ is at a value such as to prevent formation of the channel 17. In this state, the drain voltage $V_D$ is sustained at least partially by the body regions 9, and is lower than a maximum voltage threshold $V_{max}$. The maximum voltage $V_{max}$ is established in the stage of design of the device, and defines a limit of proper operation of the super-junction MOSFET 1.

However, following upon situations such as anomalous operating conditions, overvoltages at the drain region 5 (i.e., a drain voltage $V_D$ higher than the maximum voltage threshold $V_{max}$) can generate further flows of electrons 20, which, starting from the source regions 13, reach the conductive region 7 passing through the body regions 9 and, at least partially, through the conductive channels 17.

In fact, the ensemble of the source region 13, the body region 9 and the conductive region 7 forms a parasitic bipolar transistor, which is activated by drain voltages $V_D > V_{max}$. The flows of electrons 20 cause undesirable heating of the body regions 9, and in particular of the conductive channels 17. In fact, the body regions 9 (of a P type) may be represented as resistances $R_B$ connected to the base terminal of the parasitic bipolar transistors. Such heating causes a drop in the threshold voltage of the super-junction MOSFET 1, and consequently an undesirable conduction due to thermal drift. In other words, owing to the heating of the conductive channels 17 due to the flows of electrons 20, the super-junction MOSFET 1 enters a conduction state and generates the flows of majority charge carriers 18, even though it is driven so as to operate in an inhibition state.

Solutions to this problem are known.

In particular, it is common to form implanted regions having a conductivity of a P$^+$ type in the proximity of the top surface 7a in the conductive region 7, to increase the voltage of activation of the parasitic bipolar transistors, or else to integrate a clamping diode in parallel to each parasitic bipolar transistor. In this second case, the clamping diode is activated when a voltage across its ends is higher than an activation voltage $V_{att}$. If the value of the activation voltage $V_{att}$ is close to that of the maximum voltage $V_{max}$ (for example, it is equal), the overvoltages activate the clamping diode, which passes into a conduction state. An example of this solution is disclosed in the patent KR101590943, which describes a super-junction MOSFET protected by a clamping diode. However, although it has been found that this solution reduces the likelihood of thermal drift of the super-junction MOSFET, it does not guarantee better operation thereof, since there can still be flows of current 20 in the proximity of the conductive channel 17. Moreover, such a solution has an ON-state resistance $R_{on}$ that is rather high.

Thus, this solution does not allow a minimization of the $R_{on}$ given the same voltage guaranteed, which renders the device far from competitive.

BRIEF SUMMARY

One or more embodiments of the present disclosure provide a super-junction MOSFET device that may solve problems of the prior art, and a corresponding method of manufacturing.

BRIEF DESCRIPTION OF THE SEVERAL VIEWS OF THE DRAWINGS

For a better understanding of the present disclosure, a preferred embodiment, in a three-dimensional Cartesian reference system defined by the axes X, Y, and Z, is now described, purely by way of non-limiting example, with reference to the attached drawings, wherein.

DETAILED DESCRIPTION

Figure 1:
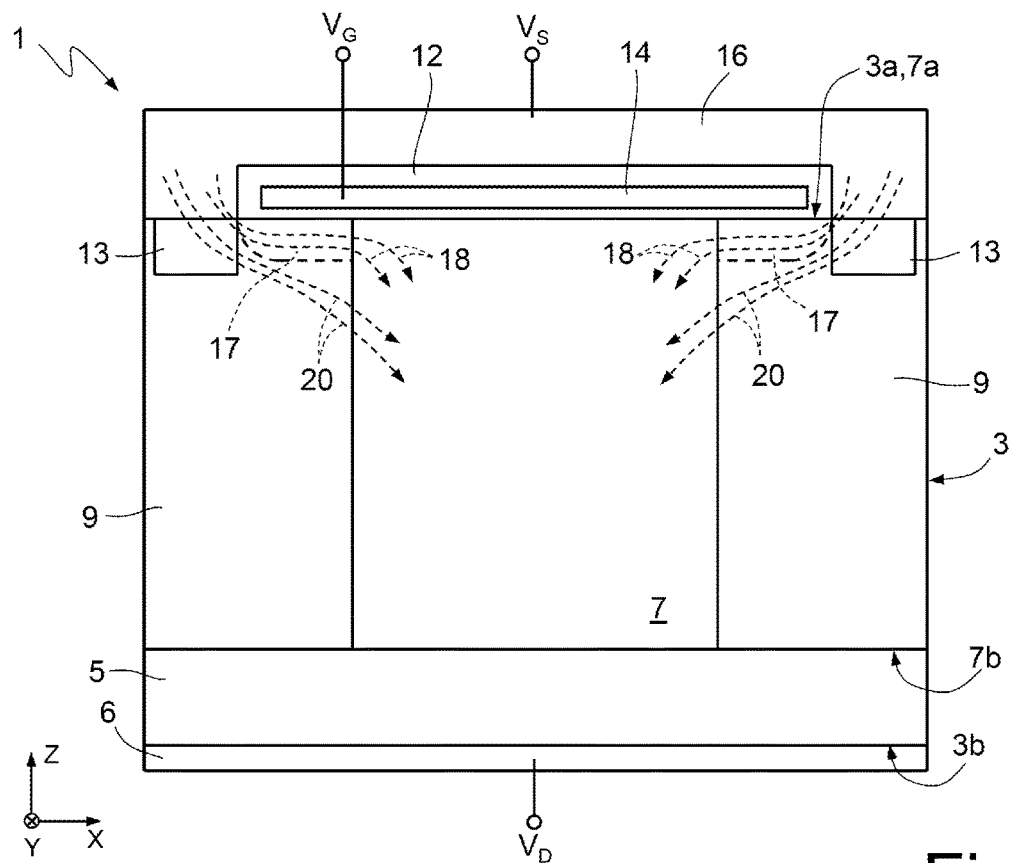
FIG. 1 is a schematic illustration of a cross-section of a super-junction MOSFET of a known type.
Figure 2:
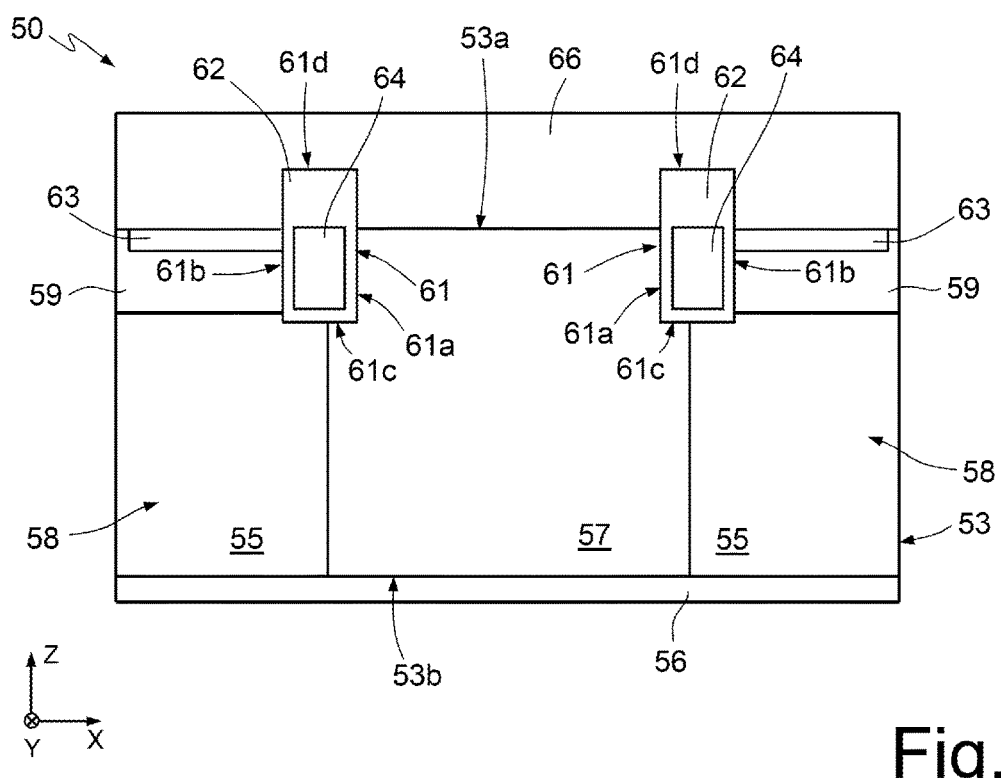
FIG. 2 is a schematic illustration of a cross-section of a super-junction MOSFET, according to an embodiment of the present disclosure.

With reference to FIG. 2, a MOSFET device 50 is illustrated, in particular a super-junction MOSFET.

The MOSFET device 50 comprises a semiconductor body 53, for example of silicon, which extends between a front side 53a and a back side 53b opposite to one another in the direction of the axis Z.

Trench gates 61 extend in the semiconductor body 53 starting from the front side 53a towards the back side 53b, without reaching the latter. In FIG. 2 two trench gates 61 are illustrated by way of example; however, it is evident that there may be any number of them.

Each trench gate 61 comprises a gate dielectric layer 62, for example of silicon oxide, which completely surrounds a gate conductive region 64; in other words, the gate dielectric layer 62 electrically insulates the gate conductive region 64 from the semiconductor body 53. The trench gates 61 have, in section view in the plane XZ, for example a rectangular shape, defined by the gate dielectric layer 62, with the larger sides that extend along the direction of the axis Z and the smaller sides that extend along the direction of the axis X. More in particular, the trench gates 61 are laterally delimited, in section view in the plane XZ, by a respective first side 61a (larger side) and a respective second side 61b (larger side), opposite to one another along the axis X. The trench gates 61 are moreover delimited at the bottom, in section view in the plane XZ, by a respective bottom side 61c (smaller side).

The sides 61a of each trench gate 61 face one another along the axis X.

Extending underneath each trench-gate region 61, in contact with the bottom side 61c (i.e., with the gate dielectric layer 62), there is a respective drain region 55. Each drain region 55 moreover extends along part of the side 61b of each trench gate 61.

Each drain region 55 is, in particular, a region implanted in the semiconductor body 53, has a conductivity of an N type, and a doping concentration of the order of $1 \cdot 10^{16}$ at/cm$^3$.

Extending over each drain region 55, at the side 61b of the trench gates 61, there is a body region 59, having a conductivity of a P type and a doping concentration of the order of $1 \cdot 10^{16}$ at/cm$^3$.

Extending inside each body region 59, at the respective sides 61b of the trench gates 61 and facing the front side 53a, there are respective source regions 63, having conductivity of an N type, and a doping concentration of the order of $1 \cdot 10^{16}$ at/cm$^3$. The source regions 63 are formed by implanting dopant species within the body regions 59.

The source regions 63 are thus separated from the respective drain regions 55 by a portion of the respective body region 59.

In this way, extending alongside each trench gate 61 there is a respective stack 58 that includes (moving along the axis Z from the front side 53a towards the back side 53b): a source region 63, a body region 59 and a drain region 55.

The trench gates 61 are separated from one another by a portion 57 of the semiconductor body 53 having a conductivity of a P type and a doping concentration of the order of $1 \cdot 10^{16}$ at/cm$^3$. The portion 57 of the semiconductor body 53 extends along the direction of the axis Z from the front side 53a as far as the back side 53b. The portion 57 of the semiconductor body 53 extends in direct electrical contact with the drain regions 55. Since, as said, the drain regions 55 extend underneath the trench gates 61, along the direction of the axis Z, also these are separated from one another by the portion 57 of the semiconductor body 53.

Thus, each drain region 55 forms an NP diode with the portion 57 of the semiconductor body 53.

The portion 57 of the semiconductor body 53 has a width, along the axis X, of approximately 3 μm and a thickness, along the direction of the axis Z, of approximately 50 μm (measured from the front side 53a to the back side 53b), whereas each drain region 55 has a width of approximately 1 μm and a thickness, measured starting from the back side 53b, of approximately 45 μm. The body regions 59 have a width of approximately 1 μm, and a thickness of approximately 3 μm. Each trench gate 61 has a width of approximately 1 μm (measured from the first side 61a to the second side 61b), and a thickness of approximately 4-5 μm (measured from the third side 61c to a top side 61d of the trench gate 61).

A metallization layer 66 moreover extends over the trench gates 61, insulated from the latter by the gate dielectric layer 61, and over the source regions 63 and the body regions 59, so as to contact the source regions 63, the body regions 59, and the metallization layer 66 electrically with one another. A metallization layer 56 extends, instead, underneath the drain regions 55 and the portion 57 of the semiconductor body 53, in direct electrical contact with the back side 53b.

Figure 3:
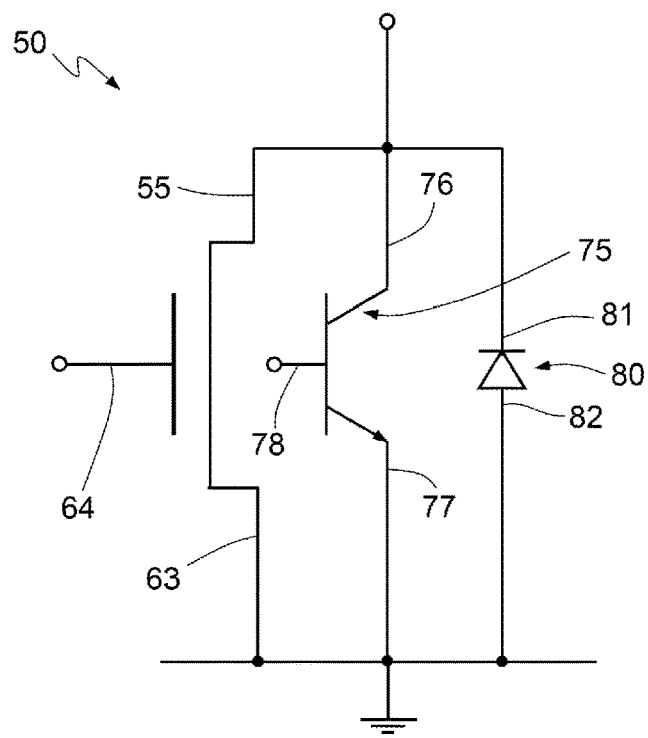
FIG. 3 shows a circuit diagram of the super-junction MOSFET of FIG. 2.

FIG. 3 illustrates a circuit diagram of the super-junction MOSFET 50. Each source region 63, the body region 59 coupled thereto, and the drain region 55 of the super-junction MOSFET 50 form, respectively, an emitter 77, a base 78, and a collector 76 of a parasitic bipolar transistor 75. Moreover, the portion 57 of the semiconductor body 53 forms with each drain region 55 respective PN junctions, illustrated in FIG. 3 as a diode 80 provided with an anode 82 (with P doping) and a cathode 81 (with N doping). Both the parasitic bipolar transistor 75 and the diode 80 are electrically connected in parallel to the super-junction MOSFET 50.

Figure 4:
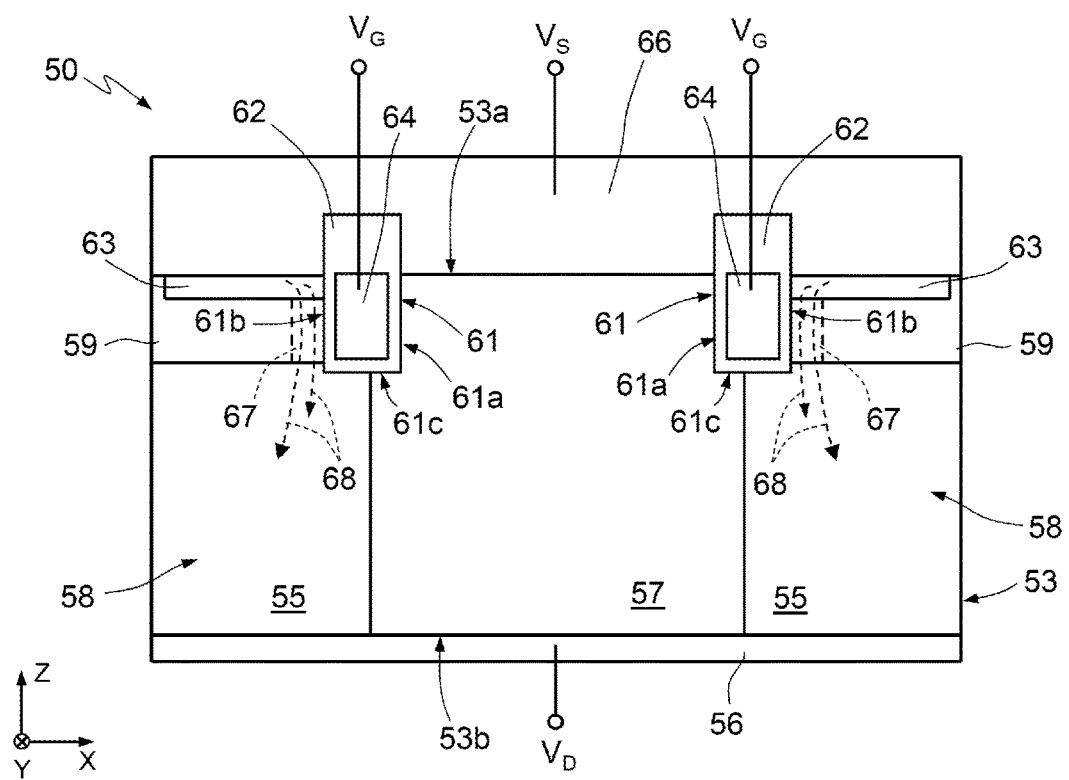
FIG. 4 is a schematic illustration of a cross-section of the super-junction MOSFET of FIG. 2, in an operating state of electrical conduction.

With reference to FIG. 4, the super-junction MOSFET 50 is illustrated in an operating state of electrical conduction. In use, the super-junction MOSFET 50 is biased by a source voltage $V_S$ (applied to the source regions 63 and to the body regions 59 via the metallization layer 66) equal to a ground-reference value GND, for example 0 V. Moreover, a drain voltage $V_D$ is applied to the drain regions 55 via the metallization layer 56. Each gate conductive region 64 is biased at a gate voltage $V_G$ such as to create, in use, a respective carrier-inversion region in each body region 59, in the proximity of the oxide layer 62, thus creating respective conductive channels 67 through which a respective flow of conduction current passes (here, the majority charge carriers are electrons). This occurs when the gate voltage $V_G$ is higher than a threshold voltage of the super-junction MOSFET 50 (for example, by approximately 10 V). The portions of the super-junction MOSFET 50 that host the conductive channels 67 and, in general, through which the flow of electrons in the conduction state is set up, form an active area, or channel area, of the super-junction MOSFET 50.

Figure 5:
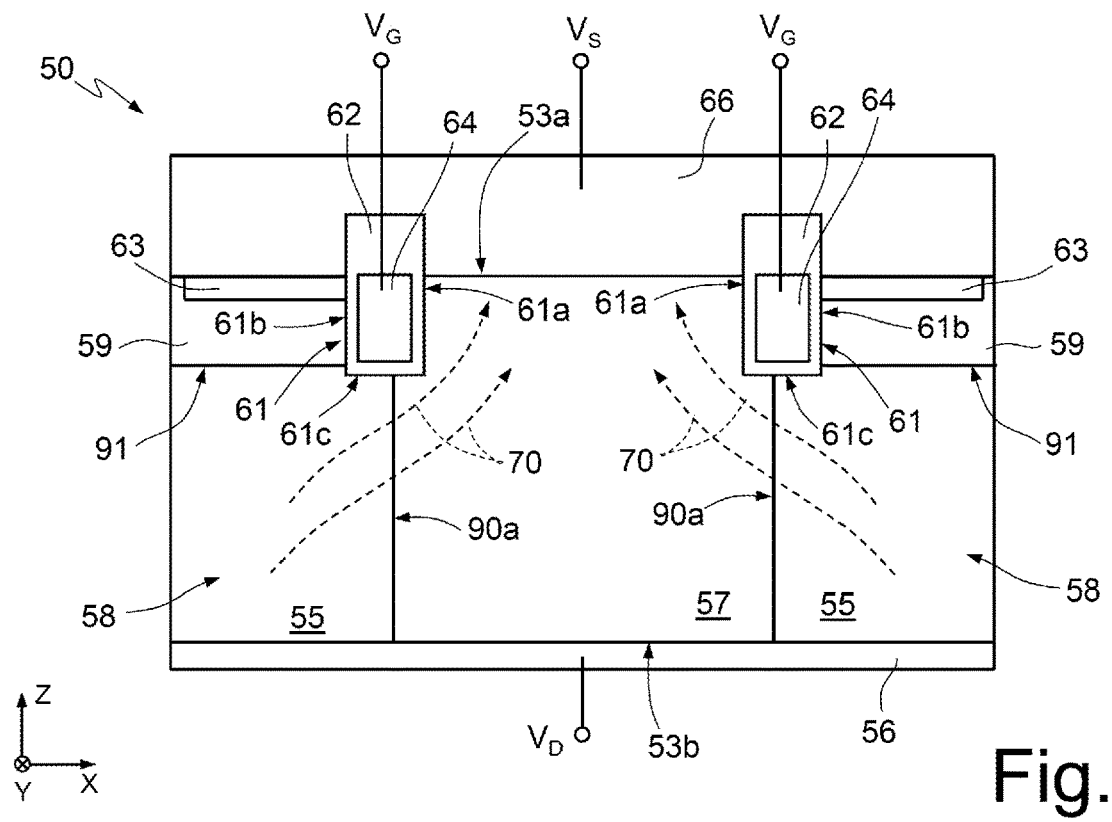
FIG. 5 is a schematic illustration of a cross-section of the super-junction MOSFET of FIG. 2, in an operating state of electrical inhibition.

FIG. 5 shows, instead, the super-junction MOSFET 50 in an operating state of electrical inhibition. In particular, when the gate voltage $V_G$ is at a value such as to prevent formation of the inversion regions 67 (i.e., it is lower than the threshold voltage of the super-junction MOSFET 50), the super-junction MOSFET 50 is in an inhibition state, and there is no generation of the conductive channel for passage of the flows of conduction current 68. In this operating state, the drain voltage $V_D$ is mainly sustained by the portion 57 of the semiconductor body 53.

In the presence of overvoltages at the drain regions 55 (i.e., when the drain voltage $V_D$ is higher than a maximum voltage $V_{max}$ of proper operation of the super-junction MOSFET 50), further flows of inhibition current 70 (also referred to as leakage currents 70) are generated, which, starting from the drain regions 55, enter the portion 57 of the semiconductor body 53 and, from here, flow towards the front side 53a of the semiconductor body 53 between the trench gates 61 (i.e., at the respective first sides 61a of the trench gates 61). In this condition, each diode 80 passes into a conduction state, because the voltage drop across its ends is higher than an activation voltage $V_{att}$, set at a value lower than that of the maximum voltage $V_{max}$ (for example, a value of approximately 600 V).

In the super-junction MOSFET 50 described above, the flows of inhibition current 70 pass through the diodes 80 and do not go through the regions that, in the conduction state of FIG. 4, host the conductive channel 67 (i.e., at the respective second sides 61b of the trench gates 61). This allows for electrical decoupling of the portions of the super-junction MOSFET 50 electrically active during the conduction state (i.e., the active area or channel area) from those electrically active during the inhibition state (flow of current through the diodes 80). This prevents the activation of the parasitic bipolar transistors 75 following upon overvoltages on the drain regions 55 during the inhibition state, and thus prevents undesirable conduction of the super-junction MOSFET 50 due to thermal drift. Consequently, the super-junction MOSFET 50 proves to be more reliable during use and less dependent upon unfavorable electrical working conditions; i.e., it presents an improved ruggedness.

The present applicant has found that the electrical properties of the super-junction MOSFET 50 can be studied via a known testing process referred to as unclamped inductive switching (UIS) test.

The contact junctions between the drain regions 55 and the portion 57 of the semiconductor body 53 (i.e., the junction areas of the diodes 80, which extend in planes YZ defined by the axes Y and Z, also referred to hereinafter as junctions of the diodes and designated by the reference number 90a) are much larger than the ones existing between the body regions 59 and the drain regions 55 (areas that extend in planes XY, defined by the axes X and Y, also referred to hereinafter as junctions of the transistors and designated by the reference number 91). Moreover, the contact junctions between the drain regions 55 and the portion 57 of the semiconductor body 53 are likewise larger than the respective junctions present between the body regions 59 and the source regions 63 (assumed as being equal to the junctions of the transistors 91). In particular, according to an embodiment of the present disclosure, the ratio between the junctions of the diodes 90a and the junctions of the transistors 91 ranges between 10 and 100. Since the likelihood of avalanche conduction phenomena occurring through a contact junction between two areas with different conductivity is proportional to the extent of the contact junction itself, the high ratio between the junctions of the diodes 90a and the junctions of the transistors 91 of the present disclosure contributes to further reduce the likelihood of the inhibition current flows 70 being deflected by the diodes 80 towards the active areas of the super-junction MOSFET 50.

Moreover, according to the present disclosure the diode 80 is integrated in the structure of the super-junction MOSFET 50 (i.e., it is internal to the super-junction MOSFET 50) and is not provided in a die region spatially separate from that of the super-junction MOSFET 50.

From an examination of the characteristics of the super-junction MOSFET device obtained according to the present disclosure, the advantages that it affords are evident.

In particular, the trench structure of the gate contacts enables electrical insulation of the active areas of the super-junction MOSFET 50 from the areas involved in avalanche conduction phenomena during the inhibition state. This prevents the activation of the parasitic bipolar transistors 75, and thus the thermal drift of the super-junction MOSFET 50.

Moreover, the use of diodes 80 internal to, or integrated in, the structure of the super-junction MOSFET 50 makes it possible to define a single biasing voltage of the super-junction MOSFET 50, and this causes a reduction of the ON-state resistance $R_{on}$ and improves the electrical performances.

Finally, it is clear that modifications and variations may be made to the super-junction MOSFET device described and illustrated herein, without thereby departing from the scope of the present disclosure.

Figure 6:
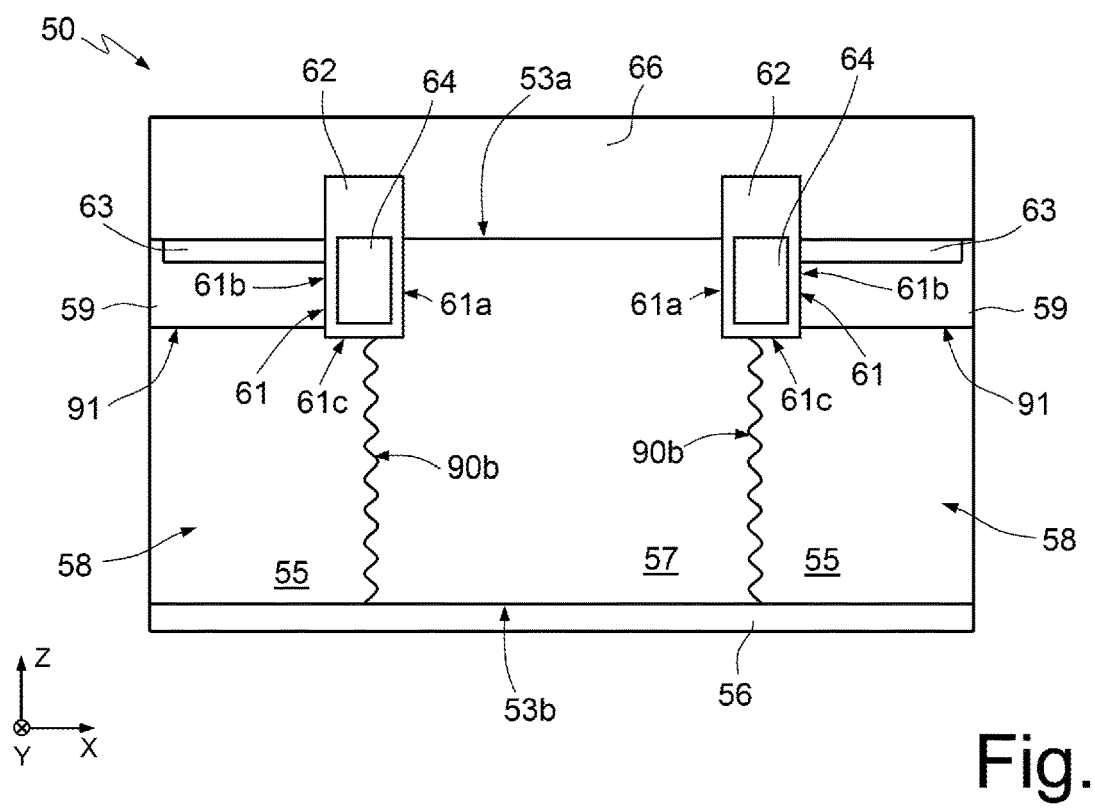
FIG. 6 is a schematic illustration of a cross-section of a super-junction MOSFET, according to a further embodiment of the present disclosure.

In particular, with reference to FIG. 6, it is possible to maximize the ratio between the junctions by making the junctions of the diodes (designated in FIG. 6 by the new reference number 90b) undulated or corrugated, instead of planar. This reduces the likelihood of conduction of the parasitic bipolar transistors 75 and thus improves reliability of the super-junction MOSFET 50. Various manufacturing processes are known for providing the corrugated junctions of the diodes 90b.

According to an embodiment of the present disclosure, a manufacturing process comprises growing a plurality of epitaxial layers (not illustrated in FIG. 6) on a substrate of semiconductor material, which has, in the context of the present description, a P conductivity. At each step of growth, a respective epitaxial layer is formed, having conductivity of a P type. Each step of growth is adapted to grow a respective epitaxial layer of thickness, along the axis Z, of a few micrometers (e.g., 3-10 µm). This is followed, for each step of growth, by: a masking step through an appropriate mask configured to expose regions of the epitaxial layer that are adapted to host the drain regions 55 (i.e., to become the drain regions 55) and to cover further regions adapted to host (i.e., to become) the portion 57 of the semiconductor body 53; and a step of implantation, at the regions exposed by the mask, of dopants of an N type to obtain portions of the epitaxial layer having a conductivity of an N type (i.e., doped wells of an N type). These wells of an N type are, in section view, superimposed on top of one another, i.e., aligned, along the direction of the axis Z.

The aforesaid implantation step is adapted to generate drain regions 55 having a conductivity of an N type. Once the step of growth of the plurality of epitaxial layers is ended, one or more thermal processes adapted to favor diffusion and activation of the implanted dopants are carried out. For instance, thermal-annealing processes are carried out at a temperature of, or slightly higher than, 1000° C.

In general, the thicknesses along Z of the epitaxial layers and of the implanted wells of an N type are such that, following upon the one or more thermal processes, the drain regions 55 of an N type are formed with a doping profile that is substantially uniform along Z (i.e., in the absence of intermediate areas of opposite conductivity).

The manufacturing process described herein makes it possible to obtain junctions of the diodes 90b characterized by a non-linear profile along the axis Z, in particular a corrugated or undulated profile. It will in any case be evident to the person skilled in the art that it is possible to implement different manufacturing processes for generating junctions of the diodes 90b that are corrugated or undulated or, in general, non-linear.

It is moreover possible that the source regions 63 and the body regions 59 are not at the same voltage, but are biased at voltages different from one another. For instance, the body region 59 may be biased at a negative voltage, without jeopardizing operation of the structure.

Moreover, although FIGS. 2, 4, and 5 show just one super-junction MOSFET 50, including two trench structures with vertical MOSFETs, it will be evident to the person skilled in the art that it is possible to implement an array of super-junction MOSFETs 50, as well as to include a larger number of trench gates 61.

It is moreover evident that what has been described applies, in a per se evident manner, to P-channel devices. In this case, the source regions 63 and drain regions 55 have a conductivity of a P type, the body 59 has a conductivity of an N type, and the portion 57 of the semiconductor body 53 has a conductivity of a P type.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A vertical-conduction MOSFET device, comprising:

a semiconductor body having a front side and a back side opposite to one another along a first direction, and having a first conductivity type;

a first trench-gate region extending in the semiconductor body starting from the front side towards the back side, and having a first side and a second side opposite to one another along a second direction orthogonal to the first direction, and a bottom side that joins the first and the second sides;

a first body region having the first conductivity type, extending in the semiconductor body at the second side of the first trench-gate region;

a first source region having a second conductivity type opposite to the first conductivity type, and extending in the first body region; and a first drain region having the second conductivity type, and extending in the semiconductor body at the second side of the first trench-gate region and underneath the first body region, until the back side of the semiconductor body, wherein:

said first source region, first body region, and first drain region are aligned with one another along the first direction and define a first channel area of the MOSFET device, which, in a conduction operating state of the MOSFET device, hosts a first conductive channel of the MOSFET device, the first drain region is at the bottom side of the first trench-gate region, on a portion of the semiconductor body having the first conductivity type, thus forming a first junction diode, which, in an inhibition operating state of the MOSFET device, is configured to cause a leakage current to flow outside said first channel area, the first source region has a doping concentration of the order of $1 \cdot 10^{16}$ at/cm$^3$;

the first drain region has a doping concentration of the order of $1 \cdot 10^{16}$ at/cm$^3$;

the first body region has a doping concentration of the order of $1 \cdot 10^{16}$ at/cm$^3$; and the portion of the semiconductor body having the first conductivity type has a doping concentration of the order of $1 \cdot 10^{16}$ at/cm$^3$.

2. The MOSFET device according to claim 1, wherein:

the first conductivity type is a P type and the second conductivity type is an N type.

3. The MOSFET device according to claim 1, wherein:

said first source region, first body region, and first drain region form, together, a first parasitic bipolar transistor electrically connected in parallel to said first junction diode, and said first junction diode has a breakdown voltage that is lower than a breakdown voltage of the first parasitic bipolar transistor.

4. The MOSFET device according to claim 3, further comprising:

a first metallization, extending at the front side of the semiconductor body and in electrical contact with said portion of the semiconductor body having the first conductivity type, with said first body region, and with said first source region; and a second metallization at the back side of the semiconductor body, wherein:

the first metallization is a source terminal of the MOSFET device, an anode terminal of the first junction diode, and an emitter terminal of the first parasitic bipolar transistor, and the second metallization is a drain terminal of the MOSFET device, a cathode terminal of the first junction diode, and a collector terminal of the first parasitic bipolar transistor.

5. The MOSFET device according to claim 1, wherein the portion of the semiconductor body and the first drain region define a corrugated diode junction of the first junction diode.

6. The MOSFET device according to claim 1, further comprising:

a second trench-gate region extending in the semiconductor body starting from the front side towards the back side, and having a first side and a second side opposite to one another along the second direction, and a bottom side that joins the first and the second sides of the second trench-gate region, the second trench-gate region being spaced apart from the first trench-gate region by the portion of the semiconductor body having the first conductivity type;

a second body region, having the first conductivity type, extending in the semiconductor body at the second side of the second trench-gate region, facing the front side;

a second source region, having the second conductivity type, extending in the body region and facing the front side; and a second drain region, having the second conductivity type, extending in the semiconductor body at the second side of the second trench-gate region and underneath the body region, until the back side of the semiconductor body, wherein:

said second source region, second body region, and second drain region are aligned with one another along the first direction and define a second channel area of the MOSFET device, which, in the conduction operating state of the MOSFET device, hosts a second conductive channel of the MOSFET device, and the second drain region borders, at the bottom side of the second trench-gate region, on the portion of the semiconductor body having the first conductivity type, thus forming a second junction diode, which, in the inhibition operating state of the MOSFET device, is configured to cause a leakage current to flow outside said second channel area.

7. The MOSFET device according to claim 6, wherein:

said second source region, second body region, and second drain region form, together, a second parasitic bipolar transistor electrically connected in parallel to said second junction diode, and said second junction diode has a breakdown voltage that is lower than a breakdown voltage of the second parasitic bipolar transistor.

8. The MOSFET device according to claim 7, further comprising:

a first metallization, extending at the front side of the semiconductor body and in electrical contact with said portion of the semiconductor body having the first conductivity type, with said first body region, and with said first source region; and a second metallization at the back side of the semiconductor body, wherein:

the first metallization is an anode terminal of the second junction diode and an emitter terminal of the second parasitic bipolar transistor, and the second metallization is a cathode terminal of the second junction diode and a collector terminal of the second parasitic bipolar transistor.

9. The MOSFET device according to claim 1, further comprising:

a metallization, extending at the front side of the semiconductor body and in electrical contact with said portion of the semiconductor body having the first conductivity type, with said first body region, and with said first source region, wherein the first trench-gate region includes a conductive gate and a gate dielectric layer that completely surrounds the conductive gate, the gate dielectric layer electrically insulating the conductive gate from the semiconductor body and from the metallization.

10. A method of manufacturing a vertical-conduction MOSFET device, comprising:

providing a semiconductor body having a front side and a back side opposite to one another along a first direction, and having a first conductivity type;

forming a trench-gate region that extends in the semiconductor body starting from the front side towards the back side, and has a first side and a second side opposite to one another along a second direction orthogonal to the first direction, and a bottom side that joins the first and the second sides;

forming a body region that has the first conductivity type, extends in the semiconductor body at the second side of the trench-gate region;

forming a source region that has a second conductivity type opposite to the first conductivity type, and extends in the body region; and forming a drain region that has the second conductivity type, and extends in the semiconductor body at the second side of the trench-gate region and underneath the body region, until the back side of the semiconductor body, wherein:

forming said source region, body region, and drain region comprise aligning said source region, body region, and drain region with one another along the first direction so as to define a channel area of the MOSFET device, which, in a conduction operating state of the MOSFET device, hosts a conductive channel of the MOSFET device, and forming the drain region comprises forming the drain region, at the bottom side of the trench-gate region, on a portion of the semiconductor body having the first conductivity type, thus forming a junction diode, which, in an inhibition operating state of the MOSFET device, is configured to cause a leakage current to flow outside the channel area, the source region has a doping concentration of the order of $1·10^{16}$ at/cm$^3$;

the drain region has a doping concentration of the order of $1·10^{16}$ at/cm$^3$;

the body region has a doping concentration of the order of $1·10^{16}$ at/cm$^3$; and the portion of the semiconductor body having the first conductivity type has a doping concentration of the order of $1·10^{16}$ at/cm$^3$.

11. The method according to claim 10, wherein forming the drain region comprises forming, between the portion of the semiconductor body and the drain region, an undulated or corrugated diode junction of the junction diode.

12. The method according to claim 11, wherein forming the undulated or corrugated diode junction comprises:
   a—forming, on a substrate of semiconductor material having the first conductivity type, an epitaxial layer having the first conductivity type and a doping concentration;
   b—applying to the epitaxial layer a mask configured to expose a region of the epitaxial layer adapted to host the drain region and protect a further region of the epitaxial layer adapted to host the portion;
   c—implanting in the epitaxial layer, using said mask, dopants having the second conductivity type, thus forming, at the region of the exposed epitaxial layer, a well having the second conductivity;
   d—repeating steps a to c one or more times, forming respective epitaxial layers hosting respective wells having the second conductivity and superimposed on top of one another along the first direction; and
   e—carrying out a thermal process of activation of the dopants of said wells.

13. A device, comprising:
a semiconductor body having a front side and a back side opposite to one another along a first direction and having a first conductivity type;
a first trench-gate region extending in the front side of the semiconductor body and having first and second sides opposite to one another along a second direction orthogonal to the first direction, and a bottom side that joins the first and the second sides;
a first body region having the first conductivity type, extending in the semiconductor body at the second side of the first trench-gate region, and facing the front side;
a first source region having a second conductivity type opposite to the first conductivity type, extending in the body region and facing the front side;
a first drain region, having the second conductivity type, extending in the semiconductor body at the second side of the first trench-gate region and underneath the body region, until the back side of the semiconductor body, wherein said first source region, first body region, and first drain region are aligned with one another along the first direction and define a first channel area of the device;
a first conductivity type portion of the semiconductor body, the first conductivity type portion extending along the first side of the first trench-gate region and directly underneath the bottom side of the first trench-gate region, and forming a first junction diode with the first drain region; and
a first metallization layer at the front side of the semiconductor body, the first metallization layer being on the first body region, the first source region, and the first conductivity type portion; and
a second metallization layer at the back side of the semiconductor body, the second metallization layer being on the first drain region and the first conductivity type portion, the first conductivity type portion extending from the first metallization layer to the second metallization layer.

14. The device according to claim 13, wherein:
the first conductivity type is a P type and the second conductivity type is an N type,
the first source region has a doping concentration of the order of $1\cdot10^{16}$ at/cm$^3$;
the first drain region has a doping concentration of the order of $1\cdot10^{16}$ at/cm$^3$;
the first body region has a doping concentration of the order of $1\cdot10^{16}$ at/cm$^3$; and
the first conductivity type portion has a doping concentration of the order of $1\cdot10^{16}$ at/cm$^3$.

15. The device according to claim 13, wherein:
said first source region, first body region, and first drain region form, together, a first parasitic bipolar transistor electrically connected in parallel to said first junction diode, and
said first junction diode has a breakdown voltage that is lower than a breakdown voltage of the first parasitic bipolar transistor.

16. The device according to claim 15, wherein:
the first metallization layer is a source terminal of the device, an anode terminal of the first junction diode, and an emitter terminal of the first parasitic bipolar transistor, and
the second metallization layer is a drain terminal of the device, a cathode terminal of the first junction diode, and a collector terminal of the first parasitic bipolar transistor.

17. The device according to claim 13, further comprising:
a second trench-gate region extending in the front side of the semiconductor body and having first and second sides opposite to one another along the second direction, and a bottom side that joins the first and the second sides of the second trench-gate region, the second trench-gate region being spaced apart from the first trench-gate region by the first conductivity type portion;
a second body region, having the first conductivity type, extending in the semiconductor body at the second side of the second trench-gate region, facing the front side;
a second source region, having the second conductivity type, extending in the body region and facing the front side; and
a second drain region, having the second conductivity type, extending in the semiconductor body at the second side of the second trench-gate region and underneath the second body region, until the back side of the semiconductor body, wherein:
said second source region, second body region, and second drain region are aligned with one another along the first direction and define a second channel area of the device; and
the first conductivity type portion extends along the first and bottom sides of the second trench-gate region and forms a second junction diode with the second drain region.

18. The device according to claim 17, wherein:
said second source region, second body region, and second drain region form, together, a second parasitic bipolar transistor electrically connected in parallel to said second junction diode, and
said second junction diode has a breakdown voltage that is lower than a breakdown voltage of the second parasitic bipolar transistor.

19. The device according to claim 18, wherein:
the first metallization layer extends in electrical contact with said second body region and with said second source region,
the first metallization layer is an anode terminal of the second junction diode and an emitter terminal of the second parasitic bipolar transistor, and the second metallization is a cathode terminal of the second junction diode and a collector terminal of the second parasitic bipolar transistor.

20. The device according to claim 13, wherein the first trench-gate region includes a conductive gate and a gate dielectric layer that completely surrounds the conductive gate, the gate dielectric layer electrically insulating the conductive gate from the semiconductor body and from the first metallization layer.

21. The device according to claim 13, wherein the first conductivity type portion and the first drain region define a corrugated diode junction of the first junction diode.

22. The device according to claim 13, wherein the first junction diode is directly underneath the bottom side of the first trench-gate region.

23. A device, comprising:
- a semiconductor body having a front side and a back side opposite to one another along a first direction and having a first conductivity type;
- a first trench-gate region extending in the front side of the semiconductor body and having first and second sides opposite to one another along a second direction orthogonal to the first direction, and a bottom side that joins the first and the second sides;
- a first body region having the first conductivity type, extending in the semiconductor body at the second side of the first trench-gate region, and facing the front side;
- a first source region having a second conductivity type opposite to the first conductivity type, extending in the body region and facing the front side;
- a first drain region, having the second conductivity type, extending in the semiconductor body at the second side of the first trench-gate region and underneath the body region, until the back side of the semiconductor body, wherein said first source region, first body region, and first drain region are aligned with one another along the first direction and define a first channel area of the device;
- a first conductivity type portion of the semiconductor body, the first conductivity type portion extending along the first side of the first trench-gate region and directly underneath the bottom side of the first trench-gate region, and forming a first junction diode with the first drain region;
- a second trench-gate region extending in the front side of the semiconductor body and having first and second sides opposite to one another along the second direction, and a bottom side that joins the first and the second sides of the second trench-gate region, the second trench-gate region being spaced apart from the first trench-gate region by the first conductivity type portion;
- a second body region, having the first conductivity type, extending in the semiconductor body at the second side of the second trench-gate region, facing the front side;
- a second source region, having the second conductivity type, extending in the body region and facing the front side; and
- a second drain region, having the second conductivity type, extending in the semiconductor body at the second side of the second trench-gate region and underneath the second body region, until the back side of the semiconductor body, wherein:

said second source region, second body region, and second drain region are aligned with one another along the first direction and define a second channel area of the device; and the first conductivity type portion extends along the first and bottom sides of the second trench-gate region and forms a second junction diode with the second drain region.

24. The device according to claim 23, wherein:
the first conductivity type is a P type and the second conductivity type is an N type,
the first source region has a doping concentration of the order of $1 \cdot 10^{16}$ at/cm$^3$;
the first drain region has a doping concentration of the order of $1 \cdot 10^{16}$ at/cm$^3$;
the first body region has a doping concentration of the order of $1 \cdot 10^{16}$ at/cm$^3$; and
the first conductivity type portion has a doping concentration of the order of $1 \cdot 10^{16}$ at/cm$^3$.

* * * * *